(12) United States Patent
Erokhin et al.

(10) Patent No.: US 7,112,509 B2
(45) Date of Patent: Sep. 26, 2006

(54) METHOD OF PRODUCING A HIGH RESISTIVITY SIMOX SILICON SUBSTRATE

(75) Inventors: Yuri Erokhin, Newburyport, MA (US); Okeg V. Konochuk, Brush Prairie, WA (US)

(73) Assignees: Ibis Technology Corporation, Danvers, MA (US); SEH America, Inc., Vancouver, WA (US)

( * ) Notice: Subject to any disclaimer, the term of this patent is extended or adjusted under 35 U.S.C. 154(b) by 0 days.

(21) Appl. No.: 10/434,571

(22) Filed: May 9, 2003

(65) Prior Publication Data

US 2004/0224477 A1 Nov. 11, 2004

(51) Int. Cl.
H01L 21/76 (2006.01)

(52) U.S. Cl. ............... 438/407; 438/423; 438/471; 438/473

(58) Field of Classification Search ........ 438/311, 438/423, 480, 519, 526, 540, 550, 766, 407, 438/471, 473
See application file for complete search history.

(56) References Cited

U.S. PATENT DOCUMENTS

| | | | |
|---|---|---|---|
| 4,342,616 A * | 8/1982 | Elliott et al. | 324/71.5 |
| 5,196,355 A * | 3/1993 | Wittkower | 438/766 |
| 5,288,650 A * | 2/1994 | Sandow | 438/766 |
| 5,891,265 A | 4/1999 | Nakai et al. | |
| 5,918,136 A | 6/1999 | Nakashima et al. | |
| 6,083,324 A * | 7/2000 | Henley et al. | 148/33.2 |
| 6,090,689 A * | 7/2000 | Sadana et al. | 438/480 |
| 6,117,231 A | 9/2000 | Fusegawa et al. | |
| 6,222,253 B1 * | 4/2001 | Sadana et al. | 257/617 |
| 6,248,642 B1 * | 6/2001 | Dolan et al. | 438/407 |
| 6,306,733 B1 * | 10/2001 | Falster et al. | 438/471 |
| 6,316,337 B1 * | 11/2001 | Ogura | 438/480 |
| 6,403,502 B1 | 6/2002 | Kobayashi et al. | |
| 6,417,078 B1 * | 7/2002 | Dolan et al. | 438/480 |
| 6,454,854 B1 | 9/2002 | Ose | |
| 6,461,933 B1 * | 10/2002 | Houston | 438/423 |
| 6,482,260 B1 | 11/2002 | Sakurada et al. | |
| 6,593,173 B1 * | 7/2003 | Anc et al. | 438/149 |
| 6,602,757 B1 * | 8/2003 | Hovel et al. | 438/407 |
| 6,617,034 B1 * | 9/2003 | Hamaguchi et al. | 428/446 |
| 6,743,495 B1 * | 6/2004 | Vasat et al. | 428/64.1 |
| 6,794,264 B1 * | 9/2004 | Dolan et al. | 438/407 |
| 6,897,084 B1 * | 5/2005 | Binns et al. | 438/58 |

(Continued)

FOREIGN PATENT DOCUMENTS

EP  1 087 041 A1  3/2001

OTHER PUBLICATIONS

Stanley Wolf and Richard N. Tauber, Silicon Processing For The VLSI Era, 1986, Lattice Press, vol. I, pp. 19-21 and 66-69.*

(Continued)

Primary Examiner—Michael Lebentritt
Assistant Examiner—Stanetta Isaac
(74) Attorney, Agent, or Firm—Thomas J. Engellenner; Reza Mollaaghababa; Nutter McClennen & Fish LLP

(57) ABSTRACT

The present invention provides a method for generating silicon-on-insulator (SOI) wafers that exhibit a high electrical resistivity. In one embodiment of a method according to the teachings of the invention, a SIMOX process is sandwiched between two Full Oxygen Precipitation (FOP) cycles that sequester interstitial oxygen present in the substrate in the form of oxide precipitates, thereby enhancing the electrical resistivity of the susbtrate.

19 Claims, 5 Drawing Sheets

U.S. PATENT DOCUMENTS

| | | | |
|---|---|---|---|
| 6,930,375 B1* | 8/2005 | Falster et al. | 257/618 |
| 2001/0039098 A1* | 11/2001 | Lu | 438/407 |
| 2002/0174828 A1* | 11/2002 | Vasat et al. | 117/90 |
| 2003/0008435 A1 | 1/2003 | Falster et al. | |
| 2005/0158969 A1* | 7/2005 | Binns et al. | 438/471 |

OTHER PUBLICATIONS

High resistivity silicon CZ substrates of BSOI for RF Applications substituting GaAs, Takao Abe et al., SEMICON Europa, slides 1-23, 2000.

* cited by examiner

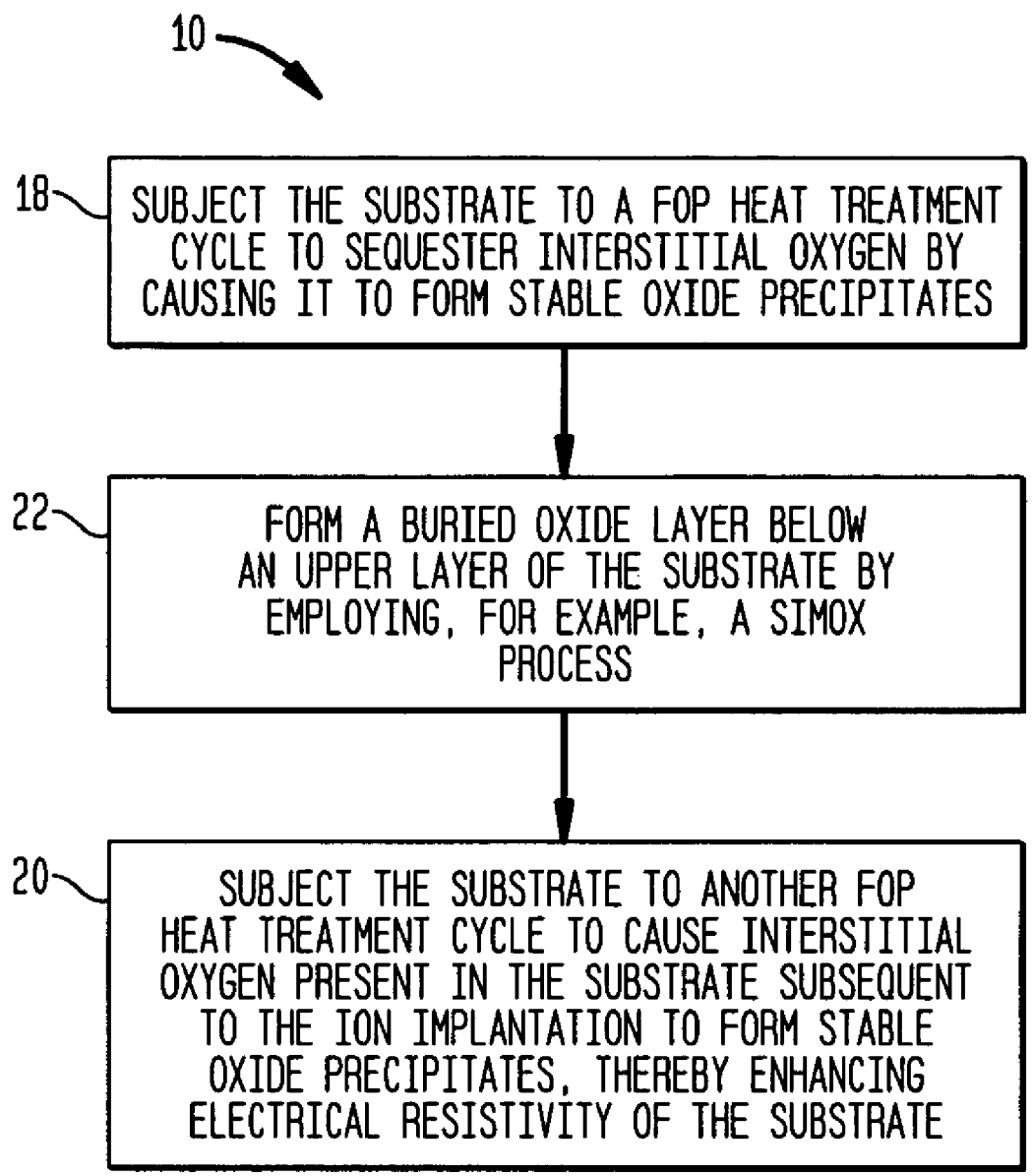

METHOD OF PRODUCING A HIGH RESISTIVITY SIMOX SILICON SUBSTRATE

BACKGROUND OF THE INVENTION

The present invention relates generally to methods for formation of an upper device layer over a buried insulating layer in a semiconductor substrate, and more particularly, to methods for forming silicon-on-insulator (SOI) wafers that exhibit a high electrical resistivity.

Silicon wafers are routinely employed in the electronic industry for manufacturing a variety of integrated circuits (IC) in which a plurality of devices can be formed on a single chip. In many such applications, the silicon wafer includes an upper silicon layer, on which devices are formed, that is separated from the bulk substrate by a continuous buried silicon oxide layer. Such silicon wafers, herein referred to as SOI wafers, can be manufactured by known techniques, such as, a technique known by the acronym SIMOX (separation by implantation of oxygen). In a SIMOX process, a buried silicon oxide layer can be generated below an upper silicon layer of a wafer by implanting oxygen ions in the wafer followed by a high temperature annealing step.

The recent research efforts in developing highly integrated IC's having a multitude of active devices and passive components, including both analog and digital components positioned in close proximity of one another, have pointed the need for providing effective electrical isolation among these components. Conventional silicon wafers are, however, cut from single silicon crystals formed by a method commonly known as Czochralski (CZ) method. Such silicon wafers contain interstitial oxygen atoms with a concentration in a range of about 20–40 ppma. The concentrations cited herein are determined according to the ASTM standard. These interstitial oxygen atoms can form electrically active crystal defects known as thermal donors, especially subsequent to steps in IC manufacturing that subject the wafer to elevated temperatures, typically at temperatures between about 350 C and 600 C. Such thermal donors can reduce the wafer's electrical resistivity, and can hence adversely affect electrical isolation among different devices formed on the wafer.

Some heat treatment techniques are known for lowering the concentration of interstitial oxygen in bulk CZ silicon wafers, thereby decreasing silicon propensity for formation of thermal donors and hence maintaining electrical resistivity of the wafers above a desired high threshold. This stabilization of electrical resistivity is, however, typically lost when the wafers are subjected to a SIMOX process to form SOI wafers.

Accordingly, it is desirable to provide methods for generating SOI wafers having high, stable electrical resistivity, for example, an electrical resistivity in excess of about 100 Ohm-cm, and preferably in excess of about 500 Ohm-cm.

SUMMARY OF THE INVENTION

The present invention provides a method for generating an upper device layer over a buried insulating layer in a semiconductor substrate, e.g., a silicon substrate, containing interstitial oxygen atoms/ions, which includes, inter alia, controlled heat treatment steps for sequestering the interstitial oxygen, thereby ensuring that the resulting wafer exhibit a high electrical resistivity, even after it has been subjected to thermal treatments common in modern IC manufacturing. It has been discovered that heat treatments before and after ion implantation can substantially improve the stability of the resistivity of SIMOX wafers formed from CZ crystals.

More specifically, in one aspect, the present invention provides a method for generating an upper silicon layer over a buried insulating layer in a silicon substrate containing interstitial oxygen by initially maintaining the substrate at one or more elevated temperatures to cause the interstitial oxygen to form stable oxide precipitates, preferably accompanied by secondary crystalline defects, so as to lower the concentration of the interstitial oxygen below approximately $4 \times 10^{17}$ $cm^{-3}$, and/or to cause at least 50 percent, and more preferably at least 70 percent, of the interstitial oxygen to be sequestered through formation of stable oxide precipitates such that the residual oxygen concentration is less than about 10 ppma. Subsequently, a selected dose of oxygen ions is implanted in the substrate to form a buried silicon oxide layer below an upper substrate layer. The ion implantation can be performed in a single stage or multiple stages. Subsequent to the implantation step, the substrate is again maintained at one or more elevated temperatures to cause interstitial oxygen present in the substrate to form stable oxide precipitates so as to lower the concentration of the interstitial oxygen below approximately $4 \times 10^{17}$ $cm^{-3}$, thereby enhancing the substrate's electrical resistivity. The heat treatment steps prior and subsequent to the ion implantation step are herein also referred to as Full Oxygen Precipitation (FOP) cycles.

In a related aspect, each FOP cycle can be performed by maintaining the substrate at a plurality of progressively increasing elevated temperatures. For example, the substrate can initially be maintained at an elevated temperature in a range of about 500 C to about 750 C, and more preferably in a range of about 600 C to about 700 C, for a time period in a range of about 1 to about 4 hours. Subsequently, the substrate can be maintained at a second elevated temperature in a range of about 700 C to about 950 C, and more preferably in a range of about 800 C to about 900 C, for a time duration in a range of about 2 to about 8 hours, and more preferably, in a range of about 3 to about 5 hours. The substrate can then be maintained at a third elevated temperature in a range of about 900 C to about 1100 C, and more preferably in a range of about 950 C to about 1050 C, for a time duration in a range of about 6 to about 24 hours, and more preferably in a range of about 12 to about 16 hours.

In another aspect, the substrate can be subjected to a high temperature annealing step subsequent to the ion implantation step in order to facilitate the formation of a continuous buried oxide layer below an upper layer of the substrate. This annealing step can be performed, for example, at a temperature in a range of about 1200 C to about 1400 C, and in an inert atmosphere, such as, an atmosphere of argon or nitrogen. In some embodiments, the annealing atmosphere can include a selected amount of oxygen, for example, from less than about 1 percent to 100 percent.

In a related aspect, the second FOP cycle can be integrated in a ramp down of the substrate's temperature subsequent to the completion of the high temperature annealing step. For example, after completion of an annealing step performed at a temperature in a range of about 1200 C to 1400 C, the substrate can be cooled down to a temperature in a range of about 500 C to about 750 C to initiate the second FOP cycle. For example, the substrate can be held at this lower temperature for a time period in a range of about 1 to about 4 hours. The substrate temperature can then be raised to a value in a range of about 700 C to about 950 C, and held at this higher temperature for a time duration in a range of about 2 to 8 hours. Subsequently, the substrate temperature can be raised to a value in a range of about 900 C to about 1100 C, and the substrate can be held at this temperature for about 6 to about 24 hours. Subsequently, the substrate can be cooled down to room temperature.

In further aspects, a single or multiple ion implantation stages can be implemented by exposing the substrate to a beam of oxygen ions having an energy in a range of about 60 keV to about 250 keV. Moreover, the dose of the implanted oxygen per implantation stage can range from about $5\times10^{14}$ cm$^{-2}$ to about $2\times10^{18}$ cm$^{-2}$, with a combined implanted oxygen dose ranging from about $5\times10^{14}$ cm$^{-2}$ to $2\times10^{18}$ cm$^{-2}$.

In another aspect, the substrate can be optionally maintained at an elevated temperature, for example, a temperature in a range of about 900 C to about 1000 C, prior to the initial FOP cycle for a period of a few hours, e.g., two hours, in order to cause depletion of interstitial oxygen in a portion of the substrate proximate to an upper surface of the substrate, e.g., a portion extending from the substrate surface to a depth of a few hundred nanometers. This heating step, which is also known as a 'denuding' step, advantageously ensures that subsequent FOP cycles would not adversely affect the crystalline quality of an upper device layer formed in this portion of the substrate over a buried oxide layer. It should, however, be understood that the methods of the invention can be practiced on a silicon substrate without utilizing a denuding step.

In another aspect, a method of the invention for generating an upper silicon layer over a buried insulating layer in a silicon substrate containing interstitial oxygen can include an initial step of maintaining the substrate successively at two or more elevated temperatures, each higher than a previous temperature, so as to cause the interstitial oxygen to form stable oxide precipitates. Each temperature is selected such that the precipitates formed at that temperature are stable at the next higher temperature. Oxygen ions are then implanted in the substrate to form a buried oxide layer below an upper layer of the substrate. Subsequently, the substrate is again maintained at two or more elevated temperatures, each higher than a previous temperature, so as to cause insterstitial oxygen present in the substrate after the ion implantation step to form stable oxide precipitates. Each temperature is selected such that the precipitates formed at that temperature are stable at the next higher temperature.

Further understanding of the invention can be obtained by reference to the following detailed description and the associated drawings, which are described briefly below.

BRIEF DESCRIPTION OF THE DRAWINGS

FIG. 1 is a flow chart depicting various steps in one embodiment of a method of the invention for generating a high resistivity silicon wafer having an upper silicon layer separated from the bulk wafer by a continuous buried silicon oxide layer, FIG. 2A schematically illustrates an SOI wafer generated in accordance with the teachings of the invention, FIG. 2B schematically illustrates implantation of oxygen ions in a silicon wafer for forming a buried oxide layer beneath a top layer of the wafer.

DETAILED DESCRIPTION

The present invention provides a method for generating an upper device layer over a buried insulating layer in a semiconductor substrate, for example, a silicon substrate, while ensuring that both the upper device layer and the remainder of the substrate exhibit high electrical resistivity, e.g., an electrical resistivity in excess of about 100 Ohm-cm, and preferably higher than 500 Ohm-cm, and more preferably higher than about 1000 Ohm-cm. More particularly, a method of the invention can advantageously sequester interstitial oxygen atoms/ions that can be present in the semiconductor substrate to inhibit formation of thermal donors, thereby improving and, or stabilizing the electrical resistivity of the substrate, and consequently, enhance the performance of devices formed in the upper layer. As discussed in detail below, in a method of the invention, a semiconductor substrate is subjected, both prior and subsequent to an ion implantation step for forming a buried oxide layer in the substrate, to a high temperature protocol, herein also referred to as Full Oxygen Precipitation (FOP) protocol/cycle, designed to cause interstitial oxygen present in the substrate to form stable oxide precipitates, thereby stabilizing a high electrical resistivity throughout the substrate.

In the following exemplary embodiments, the silicon substrate employed for formation of a silicon-on-insulator (SOI) substrate is a wafer cut from a silicon crystal that is formed by a single crystal growth method known commonly as Czochralski (CZ) method. Briefly, in the CZ method of crystal growth, a seed crystal is lowered into a volume of melted material, for example, molten electronic grade silicon, and is withdrawn slowly at a controlled rate as a crystal ingot is formed below the seed. The melted material is contained in a crucible, for example, a quartz crucible, and the seed and the crucible are typically rotated, for example, in opposite directions, in order to provide a uniform growth environment.

When a silicon crystal is formed by utilizing the CZ method, oxygen atoms can be dissolved into the silicon melt, for example, from a quartz crucible, and be trapped into the silicon single crystal while the crystal is grown. Such oxygen atoms, which are present at interstitial positions in typical concentrations of 20–40 parts per million (ppma) (measured, for example, by employing ASTM F121-79 standard), can form thermal donors that degrade the electrical resistivity of the silicon substrate, and consequently adversely affect the performance of certain electronic devices formed in the upper silicon layer.

Figure 2A:
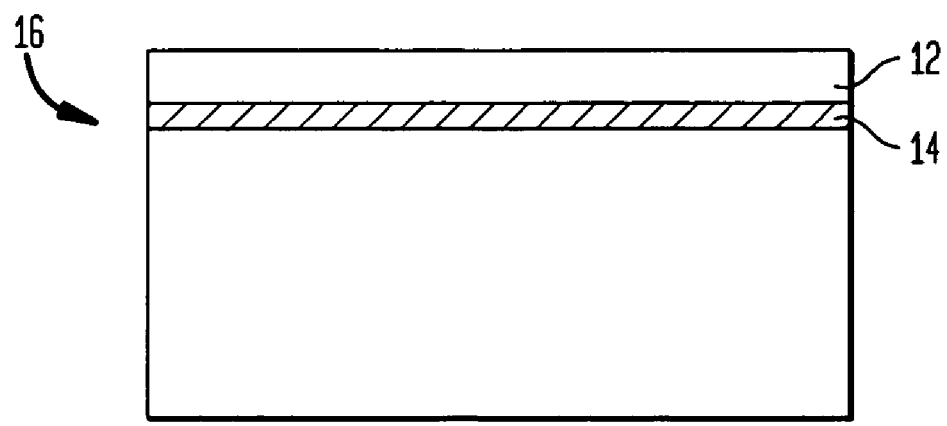

With reference to a flow chart 10 of FIG. 1 and FIG. 2A, one exemplary embodiment of the invention for generating an upper silicon layer 12 above a buried oxide layer 14, formed in a semiconductor substrate 16, includes two heat treatment steps 18 and 20, described in detail below and herein also referred to as Full Oxygen Precipitation (FOP) protocol/anneal, that ensure that interstitial oxygen atoms/ions present in the substrate are sequestered as stable oxide precipitates, thereby enhancing the electrical resistivity of the substrate.

More particularly, in this exemplary embodiment, in the initial FOP step 18, the substrate is subjected to three successive heat treatments at elevated temperatures to ensure that a substantial portion of the interstitial oxygen is converted into stable oxide precipitates. For example, subsequent to the initial FOP step, the concentration of the interstitial oxygen will be below about 10 ppma with the remainder of the interstitial oxygen originally present having been converted into stable oxide precipitates. This initial FOP protocol can be performed by initially maintaining the substrate at a temperature in a range of about 500 C to about 750 C for a time period of about 1 to about 4 hours. Subsequently, the substrate is maintained at a temperature in a range of about 700 C to about 950 C for a time duration in a range of about 2 to about 8 hours. And finally, the substrate is maintained at a temperature in a range of about 900 C to about 1100 C for a time duration in a range of about 6 to 24 hours.

This heat treatment advantageously causes the interstitial oxygen atoms/ions to form stable oxide precipitates. Formation of "stable oxide precipitates" as used herein is not intended to mean complete bonding of all interstitial oxygen but rather implies a measurable reduction in the concentration of interstitial oxygen, typically by lowering the concentration of the interstitial oxygen to a level below about $10^{17}$ cm$^{-3}$. In the above three-stage FOP heat treatment protocol, the temperature at each heat treatment stage is selected to be higher than the temperature at a previous stage. Further, the elevated temperature at each stage is chosen such that the oxide precipitates formed at that stage are stable when the substrate is exposed to a higher temperature employed at a subsequent stage. In other words, and without being limited to any particular theory, the temperature of the substrate and the duration of the heat treatment at each stage is selected such that the sizes of the oxide precipitates formed during that stage are sufficiently large such that the precipitates will not disintegrate when exposed to a subsequently higher temperature, but rather will further grow to sequester additional interstitial oxygen atoms.

Although the FOP heat treatment protocol in the above step 10 is described as a three-stage process, it should be understood that the formation of oxide precipitates in a FOP heat treatment step, such as the above step 10, can be accomplished at a single high temperature anneal step so long as the duration of the heat treatment is sufficiently long. Alternatively, two, three or more heat treatment stages can be utilized so long as the oxide precipitates formed at each stage are stable when exposed to the heat treatment of a subsequent stage. One advantage of the above exemplary three-stage FOP heat treatment protocol of the step 10, preformed at progressively higher temperatures, is that it causes formation of oxide precipitates at a first elevated temperature that can then be utilized as seed precipitates for accelerated sequestration of interstitial oxygen in subsequent higher temperature stages. This advantageously shortens the time needed to lower the concentration of the interstitial oxygen below a desired level.

Figure 2B:
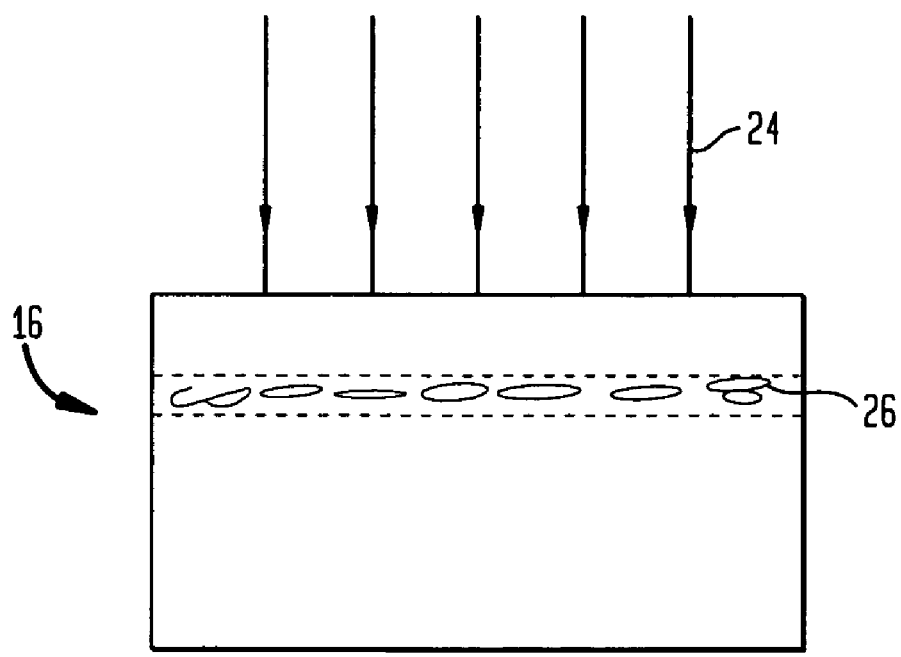

With continued reference to the flow chart 10 and reference to FIG. 2B, in a subsequent step 22, a buried insulating oxide layer is formed below an upper surface of the substrate 16 to separate an upper silicon layer from the bulk of the substrate. The insulating layer can be generated by utilizing a variety of known techniques. In one such technique, known by the acronym SIMOX (separation by implantation of oxygen), oxygen ions are implanted in the substrate to form a buried oxygen rich layer containing silicon oxide precipitates.

The oxygen implantation can be accomplished, for example, by exposing the substrate 16 to a beam of oxygen ions 24 having an energy in a range of about 60 keV to about 250 keV. Further, the oxygen dose implanted in the substrate can be selected to be in a range of about $5\times10^{14}$ to about $2\times10^{18}$ cm$^{-2}$. The ion implantation can form a buried damaged layer containing islands of silicon oxide precipitates 26.

Subsequently, the substrate can be subjected to an annealing process performed at an elevated temperature, for example, at a temperature in a range of about 1200 C to about 1400 C, to cause formation of chemical bonds between the oxygen ions in the buried damaged layer and the silicon atoms of the substrate in order to coalesce the oxide precipitates in the damaged layer into a continuous oxide layer buried below an upper layer of the silicon substrate.

The annealing process can be performed in a selected atmosphere, for example, an atmosphere of argon or nitrogen having amounts of oxygen ranging from less than about 1 percent to 100 percent. Further details regarding a SIMOX process for forming a buried insulating layer in a semiconductor substrate can be found, for example, in U.S. Pat. Nos. 5,196,355, 6,248,642, and 5,288,650, herein incorporated by reference in their entirety.

Applicants have discovered that the SIMOX process described above for forming the continuous buried oxide layer, and more particularly, the high temperature annealing process utilized as one step of the SIMOX process, can cause dissolution of at least some of the oxide precipitates of interstitial oxygen atoms formed during the initial FOP heat treatment step 18. Accordingly, with continued reference to the flow chart 10, in the subsequent step 20, the substrate is subjected to another oxygen precipitation cycle similar to that described in the above step 10 to sequester, in the form of oxide precipitates, interstitial oxygen present in the substrate.

More specifically, in the step 20, the substrate is first maintained at an elevated temperature in a range of about 500 C to about 750 C for a time duration in a range of about 1 to about 4 hours. Subsequently, the substrate is subjected to a heat treatment at a temperature in a range of about 700 C to about 950 C for a time duration in a range of approximately 2 to 8 hours, followed by another heat treatment at a temperature in a range of about 900 C to about 1100 C for a time duration in a range of about 6 to about 24 hours.

The FOP heat treatment protocol of the step 20, similar to that of the step 18, causes the interstitial oxygen to form stable oxide precipitates, thereby enhancing the electrical resistivity of the substrate. For example, the silicon substrate in which a buried oxide layer is formed according to the teachings of the invention, as described above, can exhibit an electrical resistivity higher than about 500 Ohm-cm, and preferably higher than about 1000 Ohm-cm.

Figure 3A:
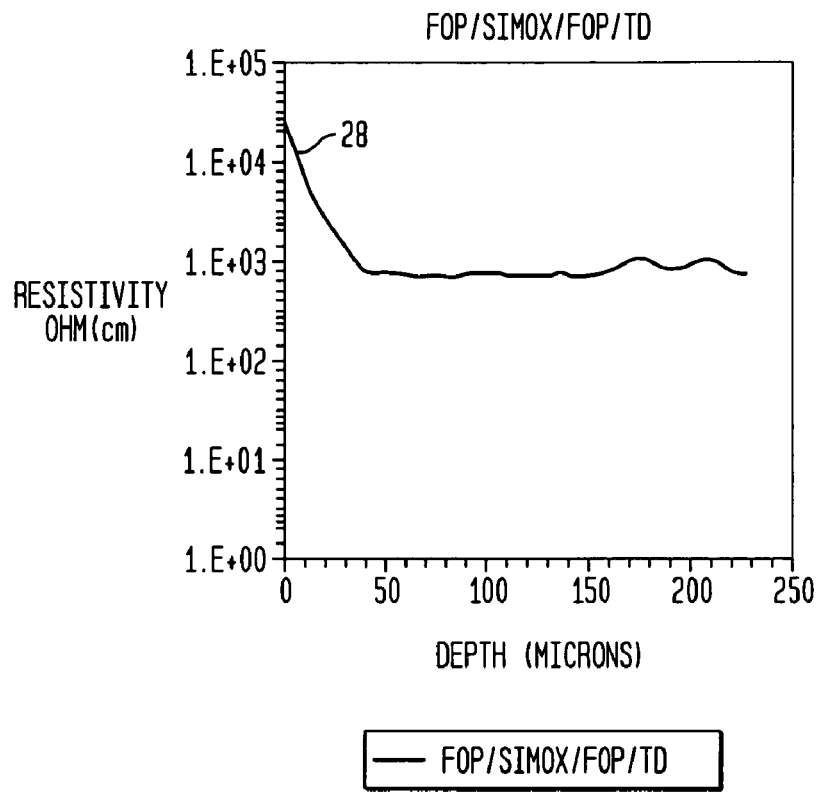
FIG. 3A is a graph depicting measured electrical resistivity of an SOI wafer of the invention as a function of depth below the wafer's top surface.

To illustrate the efficacy of the methods of the invention for generating high resistivity silicon on insulator (SOI) wafers, FIG. 3A provides a graph 28 depicting measured electrical resistivity, at various depths, of a silicon substrate in which a continuous buried insulating layer is formed according to the teachings of the invention by sandwiching a SIMOX step between two FOP heat treatment protocols, as described above. The electrical resistivity shown by the graph 28 was measured subsequent to exposing the substrate to a temperature of about 450 C for 12 hours to test the resistivity stability of the substrate subsequent to a heat treatment that is considerably more severe than a heat treatment to which the substrate can be exposed in one or more steps in a typical IC manufacturing protocol (for example, 450 C for about 20 minutes).

Figure 3B:
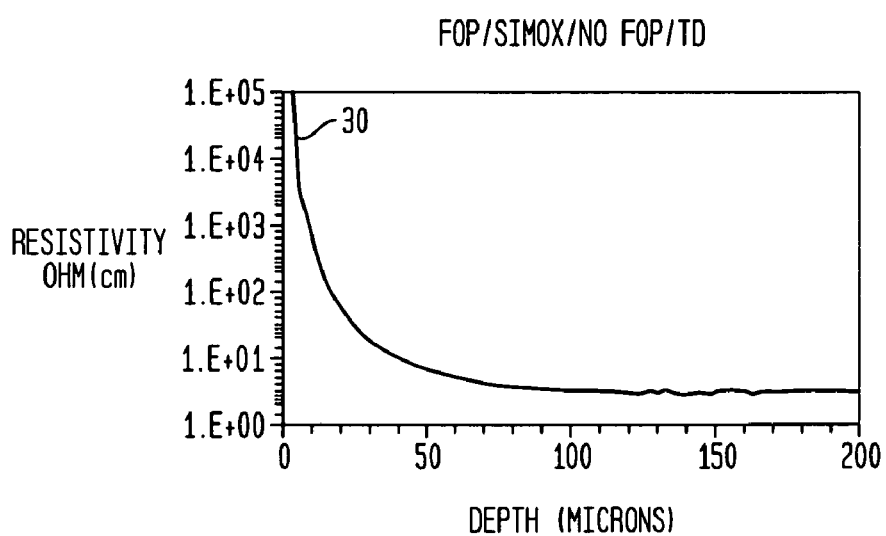
FIG. 3B is a graph depicting resistivity of a silicon wafer, obtained by CZ process, in which a buried insulating layer is formed by a conventional SIMOX process, subsequent to a heat treatment at 450 C for about 12 hours.

The graph 28 shows that even subsequent to such a heat treatment, the substrate exhibits an electrical resistivity of approximately 800 Ohm-cm over a large range of depths extending at least about 300 microns into the substrate from the substrate surface. In contrast, FIG. 3B provides a graph 30 depicting that a similar resistivity measurement performed on a silicon wafer, obtained by CZ process, in which a buried insulating layer is formed by a conventional SIMOX process, that is, without the FOP treatment protocols of the invention, exhibits a resistivity as low as 10 Ohm-cm, subsequent to a heat treatment at 450 C for about 10 hours.

Figure 4:
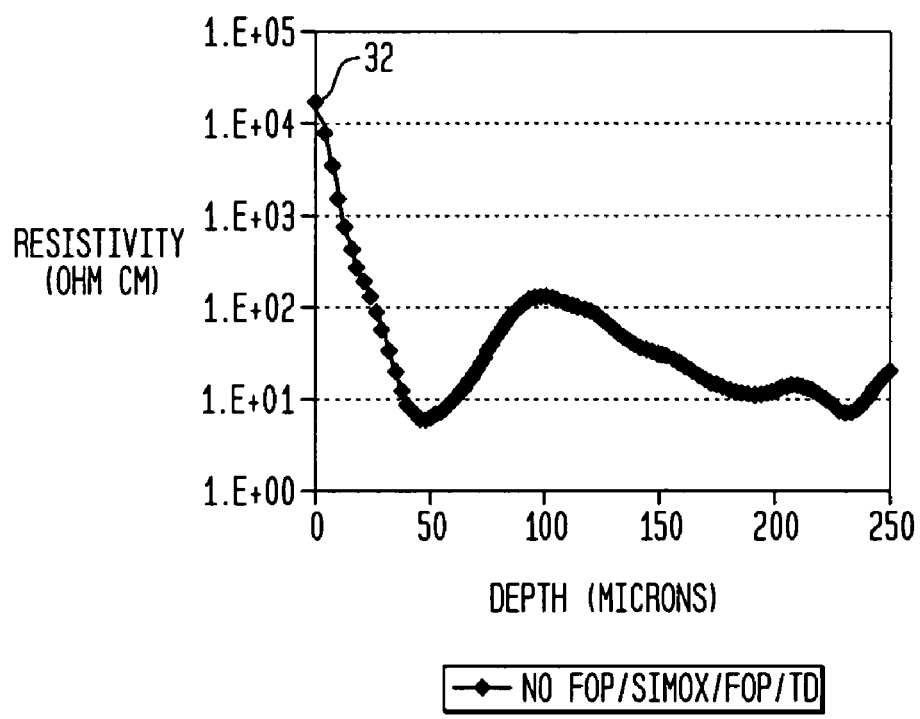
FIG. 4 is a graph depicting the electrical resistivity of an SOI wafer subjected to only one oxygen precipitation cycle, subsequent to the formation of a continuous buried oxide layer by a SIMOX process, as a function of depth below the wafer's top surface, FIG. 5 schematically illustrates an SOC integrated chip formed on an SOI wafer of the invention, FIG. 6 schematically depicts a metallic spiral pattern that can be deposited on an SOI wafer of the invention to generate an RF inductor.

Applicants have also discovered that utilizing only one oxygen precipitation cycle subsequent to formation of a buried oxide layer in a silicon substrate by a SIMOX process, rather than two oxygen precipitation cycles taught by the invention, is significantly less effective in stabilizing the electrical resistivity of the substrate. For example, FIG. 4 provides a graph 32 depicting the electrical resistivity of an SOI substrate subjected to only one oxygen precipitation cycle, subsequent to the formation of a continuous buried oxide layer by a SIMOX process, as a function of depth below the substrate surface. The electrical resistivity depicted by the graph 32 was measured after the SOI substrate was subjected to heat treatment at about 450 C for 12 hours. A comparison of the graph 32 with the graph 30 illustrates that the electrical resistivity exhibited by an SOI substrate of the invention is about two orders of magnitude higher than that exhibited by a substrate subjected to only one oxygen precipitation cycle.

Without being limited to any particular theory, the enhanced electrical resistivity of the substrate obtained by employing two FOP heat treatment steps, rather than only one after the SIMOX process, can be perhaps understood by considering that the oxide precipitates formed during the first FOP protocol can cause certain defects in the crystal lattice that remain present even if the precipitates are dissolved during the SIMOX process. These lattice defects can facilitate the formation of oxide precipitates in the second FOP heat treatment step, performed following the formation of a continuous buried oxide layer in the substrate by employing, for example, a SIMOX process.

The enhanced electrical resistivity exhibited by an SOI wafer of the invention render it suitable for formation of a variety of devices on the upper silicon layer. For example, such SOI wafers can be employed for manufacturing System-on-Chip (SOC) integrated circuits. Such an SOC integrated circuit can integrate, for example, radio frequency (RF), analog and digital circuits, as well as passive RF components, e.g., inductors, on a single chip. The high resistivity of an SOI of the invention, which is stable over a wide range of thermal processing conditions common in IC manufacturing, allows a high degree of electrical isolation among such circuits with its concomitant advantages. For example, the high electrical resistivity can minimize cross talk between analog and digital components built on the same semiconductor substrate of the invention.

Figure 5:
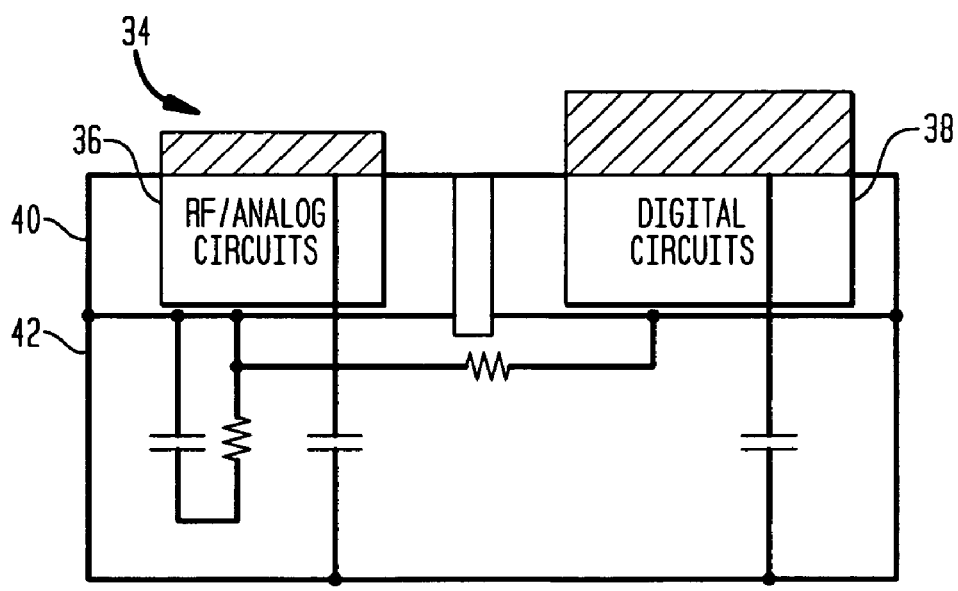

By way of example and only for illustration purposes, FIG. 5 schematically illustrates an exemplary SOC chip 34 having RF analog circuits 36 as well as digital circuits 38 formed on an upper silicon layer 40 of a substrate 42 formed in accordance with the teachings of the invention, as described above. The high electrical resistivity exhibited by the substrate 42 advantageously results in low absorption losses at high frequencies. Further, the high electrical resistivity can provide excellent electrical isolation between the analog and digital circuits, thereby minimizing cross talk between these components.

Figure 6:
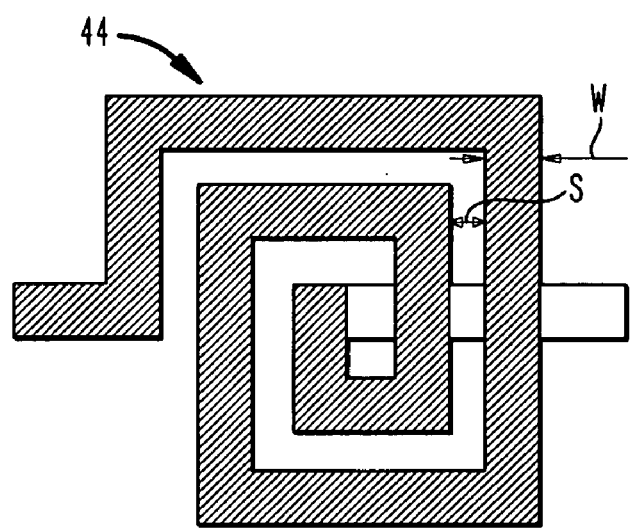

The high electrical resistivity of an SOI substrate of the invention can also be advantageous in forming inductors exhibiting high quality factors (Q), such as, RF inductors that can be, for example, integrated in RF SOC chips. Such an inductor can be formed, for example, by depositing a spiral metallic pattern, such as a spiral pattern 44 depicted in FIG. 6, on an SOI substrate of the invention. The high electrical resistivity of the substrate minimizes dielectric losses, and thereby enhances the Q factor of the inductor.

Those having ordinary skill in the art will readily appreciate that the SOI substrates of the invention can be employed for generating a variety of devices other than those described above.

The following examples are presented to provide further understanding of the methods of the invention for generating SOI substrates having high electrical resistivity.

EXAMPLE 1

A silicon wafer cut from a single silicon crystal formed by CZ method was subjected to a 'denuding' process by being maintained at a temperature of about 1000 C for approximately 3 hours. The 'denuding' process diminishes interstitial oxygen concentration in a substrate layer proximate to the substrate surface. It should be understood that the methods of the invention can be practiced on a silicon substrate without subjecting the substrate to a denuding step.

Subsequently, the substrate was subjected to a FOP heat treatment protocol by being maintained at an initial elevated temperature of approximately 650 C for about 6 hours. The substrate was then subjected to a temperature of about 800 C for approximately 6 hours, followed by a temperature of about 1000 C for approximately 16 hours. The FOP heat treatment, as discussed above, causes the interstitial oxygen atoms/ions to form stable oxide precipitates, thereby lowering the interstitial oxygen concentration in the substrate. The above 'denuding' step and the FOP heat treatment protocol were performed in a standard furnace, such as, a furnace marketed under the designation Cyclone System by MRL Industries of Sonora, Calif.

The wafer was then transferred to an ion implantation chamber of an ion implanter, such as, the ion implanter manufactured and marketed by Ibis technology corporation of Danvers, Mass., U.S.A under the trade designation IBIS 2000. A selected dose of oxygen ions, for example, a dose of about $3 \times 10^{17}$ $cm^{-2}$ was implanted in the wafer by exposing the wafer to a beam of oxygen ions having an energy of approximately 200 keV. The implantation of the oxygen ions causes the formation of a buried oxygen rich damaged layer beneath the substrate surface. Subsequently, the substrate was annealed at an elevated temperature of about 1300 C for 10 hours to cause the oxide precipitates in the oxygen rich implanted layer to coalesce and form a continuous buried silicon oxide layer with sharp $Si/SiO_2$ interfaces.

Following the formation of the continuous buried silicon oxide layer, the substrate was again subjected to a FOP heat treatment process to sequester interstitial oxygen present in the substrate. Similar to the first FOP process, the substrate was first maintained at a temperature of about 650 C for approximately 2 hours, followed by a temperature of about 800 C for about 6 hours. Subsequently, the substrate was maintained at a temperature of approximately 1000 C for 16 hours.

The electrical resistivity of the substrate, even after exposure to a temperature of 450 C for 10 hours, was measured to be at least 800 Ohm-cm up to a depth of about 300 microns below the substrate surface.

EXAMPLE 2

A silicon wafer can be subjected to an FOP heat treatment protocol by being maintained at an initial elevated temperature of approximately 650 C for about 6 hours. The substrate can then be subjected to a temperature of about 800 C for approximately 6 hours, followed by a temperature of about 1000 C for approximately 16 hours.

Subsequently, a selected dose of oxygen ions, for example, a dose of about $3\times10^{17}$ cm$^{-2}$ can be implanted in the wafer by exposing the wafer to a beam of oxygen ions having an energy of approximately 200 keV to form a buried oxygen rich damaged layer in the substrate.

The substrate can then be annealed at a temperature of 1300 C for about 10 hours to generate a continuous buried oxide layer in the oxygen rich damaged layer.

Figure 7:
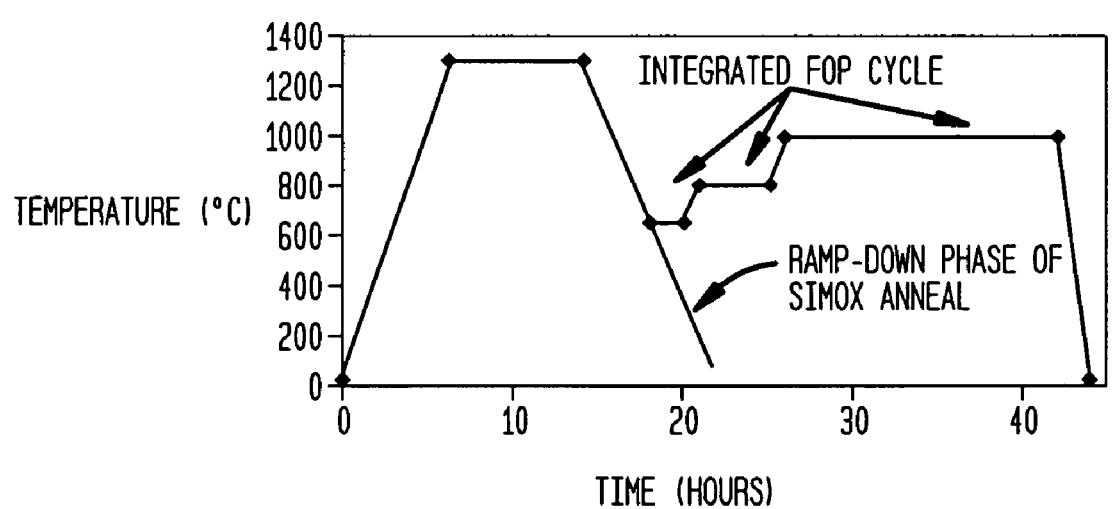
FIG. 7 is a graph depicting integration of a second FOP cycle of a method of the invention in a ramp down of the substrate's temperature after completion of a high temperature annealing step.

With reference to FIG. 7, a second FOP heat treatment protocol can be integrated in a ramp down of the substrate temperature after the completion of the annealing step at 1300 C. In particular, subsequent to the completion of the annealing step, the substrate's temperature can be lowered to about 650 to initiate a second FOP cycle. The substrate's temperature can be held at 650 for about 2 hours, and can then be ramped up to a temperature of about 800 C. The substrate can be held at a temperature of 800 C for about 6 hours. Subsequently, the substrate's temperature can be ramped up to a temperature of about 1000 C, and can be held at this temperature for about 16 hours. Subsequently, the substrate's temperature can be ramped down to room temperature.

The SOI wafer formed by this exemplary process is expected to exhibit an electrical resistivity greater than about 1000 Ohm-cm.

Those having ordinary skill in the art will appreciate that various modifications can be made to the above exemplary embodiments without departing from the scope of the invention.

What is claimed is:

1. A method of generating an upper silicon layer over a buried insulating layer in a substrate, the method comprising the steps of:
    subjecting a silicon substrate containing interstitial oxygen to a first anneal at one or more elevated temperatures for a time period sufficient to cause the interstitial oxygen to form stable oxide precipitates;
    subsequent to said first anneal, implanting oxygen ions in said substrate to form a buried oxide layer below an upper layer of the substrate; and
    subjecting said substrate to a second anneal at one or more elevated temperatures to cause interstitial oxygen present subsequent to said implantation step to form stable oxide precipitates.

2. The method of claim 1, wherein at least one of said first or second anneal lowers the concentration of the interstitial oxygen below about $4\times10^{17}$ cm$^{-3}$.

3. The method of claim 1, further comprising an annealing step performed subsequent to said ion implantation step at an elevated temperature to cause said buried oxide layer to form a continuous layer.

4. The method of claim 3, wherein said annealing step is performed at a temperature in a range of about 1200 to about 1400 C for a time period in a range of about 4 to about 40 hours.

5. The method of claim 3, wherein said annealing step is performed in any of an inert or oxidizing atmosphere.

6. The method of claim 1, wherein said implantation step comprises exposing said substrate to a beam of oxygen ions having a selected energy.

7. The method of claim 6, further comprising selecting the energy of the oxygen ion beam to be in a range of about 60 to about 250 keV.

8. The method of claim 7, wherein the step of implanting oxygen ions comprises implanting oxygen ions in the substrate in one or more implantation stages, wherein a dose of oxygen in a range of about $5\times10^{14}$ cm$^{-2}$ to about $2\times10^{18}$ cm$^{-2}$ is implanted in each stage such that a total dose of implanted oxygen ranges from about $5\times10^{16}$ cm$^{-2}$ to about $2\times10^{18}$ cm$^{-2}$.

9. The method of claim 1, further comprising the step of maintaining the substrate at a temperature of about 1000° C. for a period of about 0.5 to about 2 hours prior to said step of subjecting the substrate to a first anneal in order to cause depletion of oxygen in a region proximate to an upper surface of the substrate.

10. A method of generating an upper silicon layer over a buried insulating layer in a substrate, the method comprising the steps of:
    subjecting a silicon substrate containing interstitial oxygen to a first anneal at one or more elevated temperatures to cause the interstitial oxygen to form stable oxide precipitates;
    implanting oxygen ions in said substrate to form a buried oxide layer below an upper layer of the substrate; and
    subjecting said substrate to a second anneal at one or more elevated temperatures to cause interstitial oxygen present subsequent to said implantation step to form stable oxide precipitates
    wherein the step of subjecting the substrate to said first anneal comprises:
    maintaining the substrate at a first elevated temperature in a range of about 500° C. to about 750° C. for a time period in a range of about 1 to 4 hours;
    maintaining the substrate at a second elevated temperature in a range of about 700° C. to about 950° C. for a time period in a range of about 2 to 8 hours; and
    maintaining the substrate at a third elevated temperature in a range of about 900° C. to about 1100° C. for a time period in a range of about 6 to 24 hours.

11. A method of generating an upper silicon layer over a buried insulating layer in a substrate, the method comprising the steps of:
    subjecting a silicon substrate containing interstitial oxygen to a first anneal at one or more elevated temperatures to cause the interstitial oxygen to form stable oxide precipitates;
    implanting oxygen ions in said substrate to form a buried oxide layer below an upper layer of the substrate; and
    subjecting said substrate to a second anneal at one or more elevated temperatures to cause interstitial oxygen present subsequent to said implantation step to form stable oxide precipitates, wherein the step of subjecting the substrate to said second anneal comprises:
  maintaining the substrate at a first elevated temperature in a range of about 500° C. to about 750° C. for a time period in a range of about 1 to 4 hours;
  maintaining the substrate at a second elevated temperature in a range of about 700° C. to about 900° C. for a time period in a range of about 2 to 8 hours; and
  maintaining the substrate at a third elevated temperature in a range of about 900° C. to about 1100° C. for a time period in a range of about 6 to 24 hours.

12. A method of generating an upper silicon layer over a buried insulating layer in a silicon substrate containing interstitial oxygen, the method comprising the steps of:
  subjecting the substrate to a first anneal at one or more elevated temperatures for a time duration sufficient to form stable oxide precipitates so as to reduce the concentration of interstitial oxygen to about less than 10 ppma;
  subsequent to said first anneal, implanting oxygen ions in said substrate to form a buried oxide layer below an upper layer of the substrate; and
  subjecting said substrate to a second anneal at one or more elevated temperatures so as to reduce the concentration of interstitial oxygen present in the substrate subsequent to said implantation to about less than 10 ppma by formation of stable oxide precipitates.

13. A method of generating an upper silicon layer over a buried insulating layer in a silicon substrate containing interstitial oxygen, the method comprising the steps of:
  causing the interstitial oxygen to form stable oxide precipitates by subjecting the substrate successively to first, second and third temperatures, said first temperature being in a range of about 500° C. to 750° C., said second temperature being in a range of about 700° C. to about 950° C., and said third temperature being in a range of about 900° C. to about 1100° C.;
  implanting oxygen ions in said substrate to form a buried oxide layer below an upper layer of the substrate; and
  causing interstitial oxygen present in said substrate subsequent to said implantation step to form stable oxide precipitates by subjecting the substrate successively to first, second and third temperatures, said first temperature being in a range of about 500° C. to 750° C., said second temperature being in a range of about 700° C. to about 950° C., and said third temperature being in a range of about 900° C. to about 1100° C.

14. The method of claim 13, wherein either step of causing the interstitial oxygen to form stable oxide precipitates comprises maintaining the substrate at said first temperature for a time period in a range of about 1 to about 4 hours.

15. The method of claim 13, wherein either step of causing the interstitial oxygen to form stable oxide precipitates comprises maintaining the substrate at said second temperature for a time period in a range of about 2 to about 8 hours.

16. The method of claim 13, wherein either step of causing the interstitial oxygen to form stable oxide precipitates comprises maintaining the substrate at said third temperature for a time period in a range of about 4 to about 24 hours.

17. A method of generating an upper silicon layer over a buried insulating layer in a semiconductor substrate, the method comprising the steps of:
  subjecting the substrate successively to two or more elevated temperatures each higher than a previous temperature for a time duration sufficient so as to cause the interstitial oxygen to form stable oxide precipitates, each temperature being selected such that the precipitates formed at that temperature are stable at the next higher temperature;
  implanting oxygen ions in said substrate to form a buried oxide layer below an upper layer of the substrate; and
  subjecting the substrate successively to two or more elevated temperatures, each higher than a previous temperature, so as to cause interstitial oxygen present in said substrate subsequent to said implantation step to form stable oxide precipitates, each temperature being selected such that the precipitates formed at that temperature are stable at the next temperature.

18. A method of generating an upper silicon layer over a buried insulating layer in a semiconductor substrate, the method comprising the steps of:
  subjecting the substrate successively to two or more elevated temperatures each higher than a previous temperature so as to cause the interstitial oxygen to form stable oxide precipitates, each temperature being selected such that the precipitates formed at that temperature are stable at the next higher temperature;
  implanting oxygen ions in said substrate to form a buried oxide layer below an upper layer of the substrate; and
  subjecting the substrate successively to two or more elevated temperatures, each higher than a previous temperature, so as to cause interstitial oxygen present in said substrate subsequent to said implantation step to form stable oxide precipitates, each temperature being selected such that the precipitates formed at that temperature are stable at the next temperature, wherein at least one of the steps of subjecting the substrate successively to two or more elevated temperatures comprises:
    maintaining the substrate at a first elevated temperature in a range of about 500° C. to about 750° C. for a time period in a range of about 1 to 4 hours;
    maintaining the substrate at a second elevated temperature in a range of about 700° C. to about 900° C. for a time period in a range of about 2 to 8 hours; and
    maintaining the substrate at a third elevated temperature in a range of about 900° C. to about 1100° C. for a time period in a range of about 4 to 24 hours.

19. A method of generating an upper silicon layer over a buried insulating layer in a silicon substrate containing interstitial oxygen, the method comprising the steps of:
  subjecting the substrate to one or more elevated temperatures to cause the interstitial oxygen to form stable oxide precipitates so as to lower a concentration of said interstitial oxygen below approximately $4 \times 10^{17}$ cm$^{-3}$;
  implanting oxygen ions in said substrate to form an oxygen rich layer having oxide precipitates below an upper layer of the substrate;
  annealing the substrate at an annealing temperature for a selected time period sufficient to cause formation of a continuous oxide layer in said oxygen rich layer, and
  cooling said substrate from said annealing temperature to an initial temperature of a heat treatment protocol for causing oxygen present in said substrate subsequent to said annealing step to form stable oxide precipitates so as to lower a concentration of said interstitial oxygen below about $4 \times 10^{17}$ cm$^{-3}$.

* * * * *

UNITED STATES PATENT AND TRADEMARK OFFICE
CERTIFICATE OF CORRECTION

| | | |
|---|---|---|
| PATENT NO. | : 7,112,509 B2 | Page 1 of 1 |
| APPLICATION NO. | : 10/434571 | |
| DATED | : September 26, 2006 | |
| INVENTOR(S) | : Yuri Erokhin and Oleg V. Konochuk | |

It is certified that error appears in the above-identified patent and that said Letters Patent is hereby corrected as shown below:

Title page, item [75]
INVENTORS:
should read Oleg V. Kononchuk, Brush Prairie, WA Signed and Sealed this Twenty-seventh Day of February, 2007

JON W. DUDAS
*Director of the United States Patent and Trademark Office*